(12) United States Patent
Holland et al.

(10) Patent No.: US 11,374,095 B2
(45) Date of Patent: Jun. 28, 2022

(54) GE BASED SEMICONDUCTOR DEVICE AND A METHOD FOR MANUFACTURING THE SAME

(71) Applicant: TAIWAN SEMICONDUCTOR MANUFACTURING CO., LTD., Hsinchu (TW)

(72) Inventors: Martin Christopher Holland, Bertem (BE); Blandine Duriez, Brussels (BE)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 32 days.

(21) Appl. No.: 17/101,986

(22) Filed: Nov. 23, 2020

(65) Prior Publication Data
US 2021/0104606 A1    Apr. 8, 2021

Related U.S. Application Data

(62) Division of application No. 15/908,135, filed on Feb. 28, 2018, now Pat. No. 10,847,622.

(Continued)

(51) Int. Cl.
*H01L 29/167* (2006.01)
*H01L 29/78* (2006.01)
(Continued)

(52) U.S. Cl.
CPC ...... *H01L 29/167* (2013.01); *H01L 21/02381* (2013.01); *H01L 29/0847* (2013.01); *H01L 29/1054* (2013.01); *H01L 29/66795* (2013.01); *H01L 29/66803* (2013.01); *H01L 29/785* (2013.01); *H01L 21/0245* (2013.01);
(Continued)

(58) Field of Classification Search
CPC ..... H01L 29/161–167; H01L 29/66795; H01L 29/785; H01L 21/26506; H01L 29/66628; H01L 29/167; H01L 29/16; H01L 29/41783; H01L 21/823814; H01L 21/823418–823425; H01L 21/02381; H01L 29/1604; H01L 21/18–28255; H01L 21/02532; H01L 21/0245
See application file for complete search history.

(56) References Cited

U.S. PATENT DOCUMENTS 8,962,400 B2    2/2015    Tsai et al.
9,093,514 B2    7/2015    Tsai et al.
(Continued)

OTHER PUBLICATIONS

Website: https://en.wikipedia.org/wiki/Transmission_line_measurement.
(Continued)

*Primary Examiner* — Nelson Garces
(74) *Attorney, Agent, or Firm* — McDermott Will & Emery LLP

(57) ABSTRACT

A field effect transistor includes a channel made of germanium and a source/drain portion. The source/drain portion includes a germanium layer, an interfacial epitaxial layer over the germanium layer, a semiconductor layer over the interfacial epitaxial layer, and a conducting layer over the semiconductor layer. The interfacial epitaxial layer contains germanium and an element from the semiconductor layer and has a thickness in a range from about 1 nm to about 3 nm.

20 Claims, 14 Drawing Sheets

Related U.S. Application Data

(60) Provisional application No. 62/585,232, filed on Nov. 13, 2017.

(51) Int. Cl.
*H01L 29/66* (2006.01)
*H01L 21/02* (2006.01)
*H01L 29/10* (2006.01)
*H01L 29/08* (2006.01)
*H01L 29/417* (2006.01)
*H01L 29/161* (2006.01)
*H01L 29/165* (2006.01)
*H01L 29/16* (2006.01)

(52) U.S. Cl.
CPC .... *H01L 21/0262* (2013.01); *H01L 21/02532* (2013.01); *H01L 21/02576* (2013.01); *H01L 29/16* (2013.01); *H01L 29/161* (2013.01); *H01L 29/165* (2013.01); *H01L 29/41783* (2013.01)

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,608,116 B2 | 3/2017 | Ching et al. | |
| 9,812,363 B1 | 11/2017 | Liao et al. | |
| 9,853,101 B2 | 12/2017 | Peng et al. | |
| 9,859,380 B2 | 1/2018 | Lee et al. | |
| 2008/0121932 A1* | 5/2008 | Ranade | H01L 29/66545 257/E21.426 |
| 2010/0096680 A1* | 4/2010 | Mouli | H01L 29/6656 257/296 |
| 2014/0252469 A1 | 9/2014 | Lee et al. | |
| 2015/0093868 A1 | 4/2015 | Obradovic et al. | |
| 2018/0151677 A1 | 5/2018 | Glass et al. | |

OTHER PUBLICATIONS

Non-Final Office Action issued in U.S. Appl. No. 15/908,135, dated May 3, 2019.

Final Office Action issued in U.S. Appl. No. 15/908,135, dated Oct. 22, 2019.

Non-Final Office Action issued in U.S. Appl. No. 15/908,135, dated Apr. 9, 2020.

Notice of Allowance issued in U.S. Appl. No. 15/908,135, dated Jul. 22, 2020.

* cited by examiner

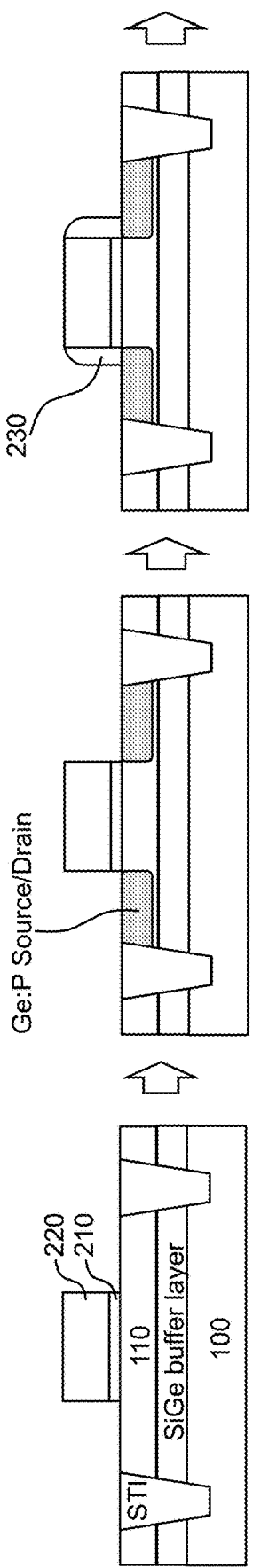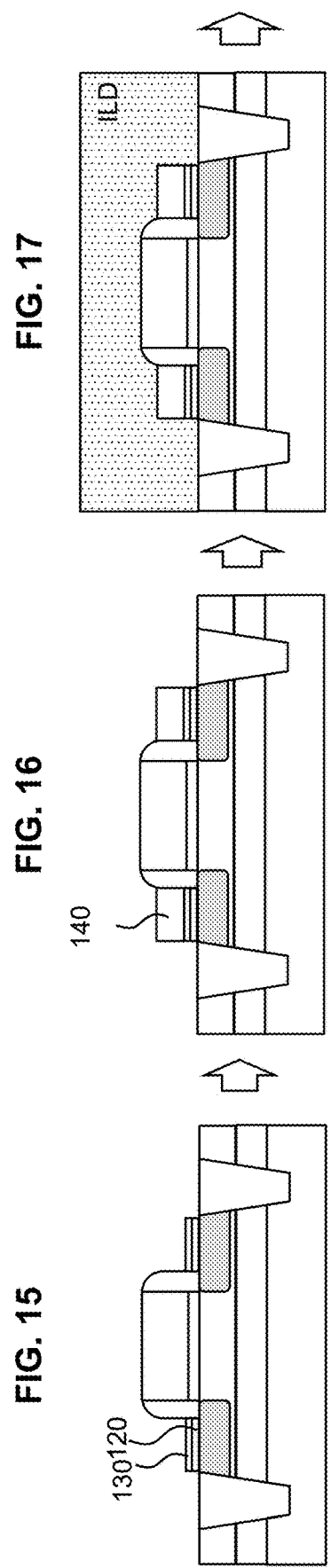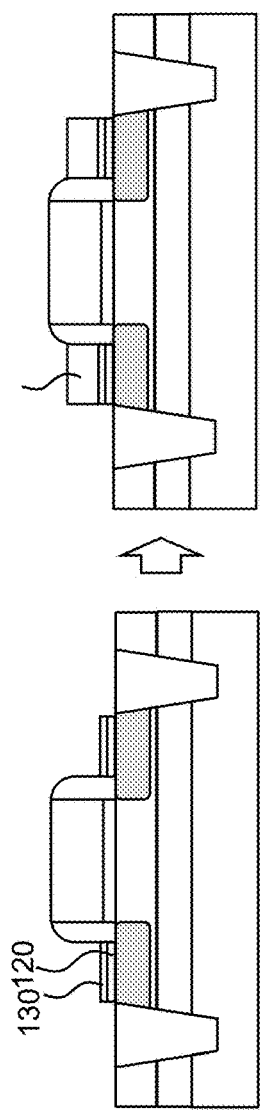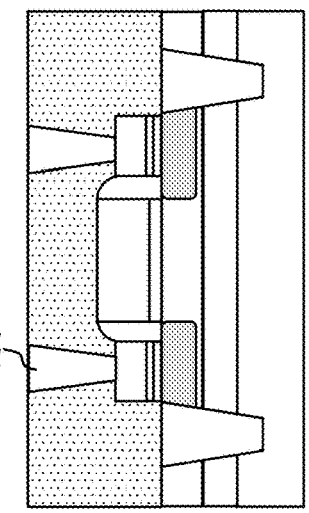

US 11,374,095 B2

GE BASED SEMICONDUCTOR DEVICE AND A METHOD FOR MANUFACTURING THE SAME

RELATED CASE

This application is a Divisional of U.S. patent application Ser. No. 15/908,135 filed on Feb. 28, 2018, which claims priority to U.S. Provisional Application 62/585,232 filed Nov. 13, 2017, the entire disclosure of the two applications are incorporated herein by reference.

TECHNICAL FIELD

The disclosure relates to a heterostructure or a semiconductor stacked structure and transistor device having a silicon-germanium interface and method of manufacturing the same.

BACKGROUND

Germanium has four times higher mobility of charge carriers than that in silicon. Therefore, germanium is used in electronic device with less voltage applied to draw the charge carriers along circuits, i.e. less energy consumption. Germanium on silicon structures are widely used in semiconductor devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 15, 16, 17, 18, 19, 20, and 21 show operations of forming the planar transistor device of FIG. 14.

FIG. 22($b$) shows a cross-sectional view of the finFET device by cutting along the source/drain region of the finFET.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

For Si on Ge structures, the as-grown dislocation density is normally in the range of $10^9$ to $10^{10}$ cm$^{-2}$, which makes practical applications of the Si on Ge structure difficult. An annealing process may be used in the epitaxial reactor following the growth of a Si layer to reduce the dislocation. With the advancement of technology to the nanometer node, the thermal budget in a semiconductor manufacturing operation becomes smaller and smaller, which may prevent the use of an annealing process after Si layer growth. Thus, there is a demand for a highly efficient heterostructure or transistor device having an interface of germanium and silicon. In the present disclosure, methods for manufacturing a semiconductor device having improved interfacial properties between Si and Ge are disclosed.

Figure 1:
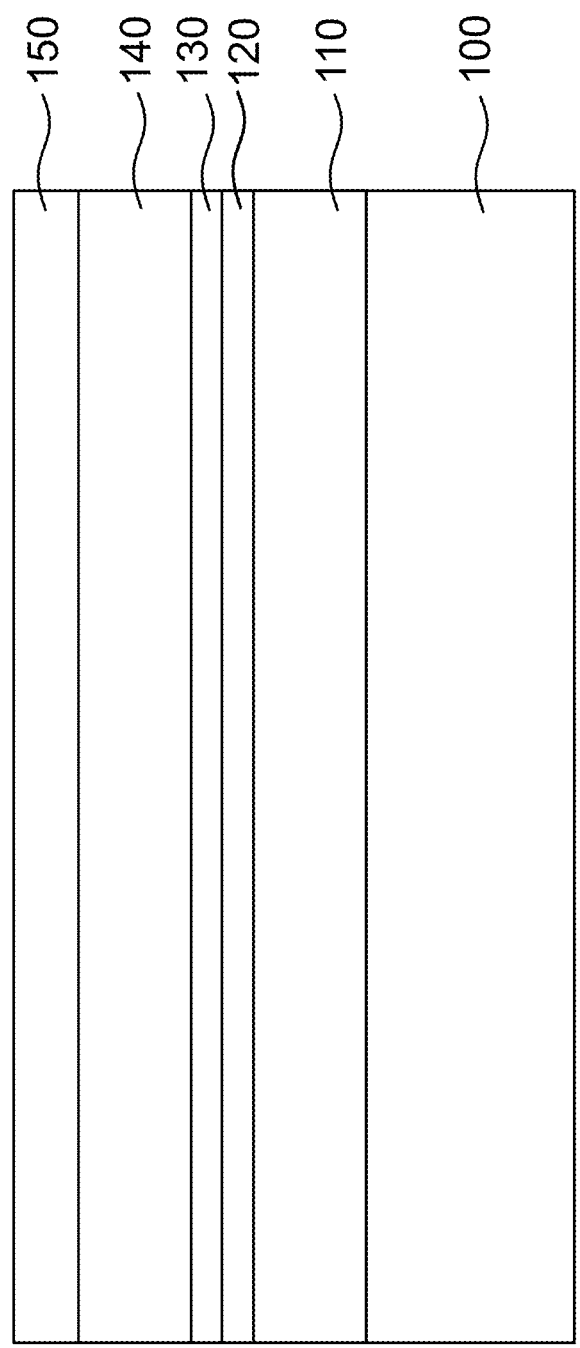
FIG. 1 shows a heterostructure used in a semiconductor device, according to an embodiment of the present disclosure.

FIG. 1 shows a heterostructure or a stacked semiconductor structure according to an embodiment of the present disclosure. In some embodiments, the heterostructure is a source/drain structure of a field effect transistor (FET). In FIG. 1, a heterostructure is disposed on a substrate 100. In some embodiments, the substrate 100 includes a single crystalline semiconductor layer on at least its surface portion. The substrate 100 may include a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 100 is made of crystalline silicon.

The heterostructure includes a first semiconductor layer 110, a first interfacial epitaxial layer 120, a second interfacial epitaxial layer 130, a second semiconductor layer 140, and a conducting metallic contact layer 150. The first semiconductor layer 110 is disposed over the substrate 100 as a fin structure. The first semiconductor layer 110 includes a germanium layer. In some embodiments, the germanium layer is doped with an n-type dopant, such as phosphorus, to increase the number of charge carriers and enhance the coupling between the first semiconductor layer 110 and the conducting metallic contact layer 150.

The first semiconductor layer 110 can be a phosphorus doped germanium layer. In some embodiments, one or more buffer layers are disposed between the Si substrate 100 and the Ge first semiconductor layer 110 to relax the lattice mismatch between Ge and Si.

The second semiconductor layer 140 includes a silicon layer in some embodiments. Also, the second semiconductor layer 140 is doped by n-type dopants to increase the charge carrier concentrations, and the n-type dopant includes phosphorus in certain embodiments. In this way, the second semiconductor layer 140 can be a phosphorus doped silicon layer. The P doped Si layer can reduce contact resistance at the interface between the conducting metallic contact layer 150 and the second semiconductor layer 140.

The first interfacial epitaxial layer 120 and the second interfacial epitaxial layer 130 are disposed on the first semiconductor layer 110. A second semiconductor layer 140 is disposed on the interfacial epitaxial layers 120 and 130. In some embodiments, the first interfacial epitaxial layer 120 includes the elements of the first semiconductor layer 110 and the second semiconductor layer 140. In some embodiments, the first interfacial epitaxial layer 120 is a SiGe layer disposed on the first semiconductor layer 110 of phosphorus doped germanium layer and disposed below the second semiconductor layer 140 of phosphorus doped silicon.

In some embodiments, the second interfacial epitaxial layer 130 includes the elements of the first semiconductor layer 110 and the second semiconductor layer 140. In some embodiments, the second interfacial epitaxial layer 130 is a SiGe layer disposed over the first interfacial epitaxial layer 120 and disposed below the second semiconductor layer 140 of phosphorus doped silicon layer. In some embodiments, the first interfacial epitaxial layer 120 is a SiGe layer and the second interfacial epitaxial layer 130 is a SiGe layer. In some embodiments, the composition of the SiGe layer of the first interfacial epitaxial layer 120 is different from the composition of the SiGe layer of the second interfacial epitaxial layer 130. In certain embodiments, the first interfacial epitaxial layer 120 is a $Si_xGe_{1-x}$ layer and the second interfacial epitaxial layer 130 is a $Si_yGe_{1-y}$ layer, where x is not equal to y. In some embodiments, the first interfacial epitaxial layer 120 is a $Si_xGe_{1-x}$ layer and the second interfacial epitaxial layer 130 is a $Si_yGe_{1-y}$ layer, where x is less than y. In some embodiments, $0.1 \leq x \leq 0.5$ and $0.4 \leq y \leq 0.8$, where x<y. In certain embodiments, the first interfacial epitaxial layer 120 is a $Si_{0.3}Ge_{0.7}$ layer, and the second interfacial epitaxial layer 130 is a $Si_{0.6}Ge_{0.4}$ layer. In some embodiments, either the first interfacial epitaxial layer 120 or the second interfacial epitaxial layer 130 is not used.

In some embodiments, one interfacial epitaxial layer having a composition $Si_zGe_{1-z}$ is disposed between the first semiconductor layer 110 and the second semiconductor layer 140, and z changes (increases) from the first semiconductor layer 110 toward the second semiconductor layer 140.

The contact layer 150 is formed of a conductive metallic layer or an electrically conducting layer, including one or more of Co, Ni, W, Ti, Ta, Cu, Al, Mo, TiN, TaN, $WSi_2$, Ni—Si, Co—Si, WN, TiAlN, TaCN, TaC, TaSiN, metal alloys such as Ti—Al alloy, Al Cu alloy, other suitable materials, and/or combinations thereof.

Figure 2:
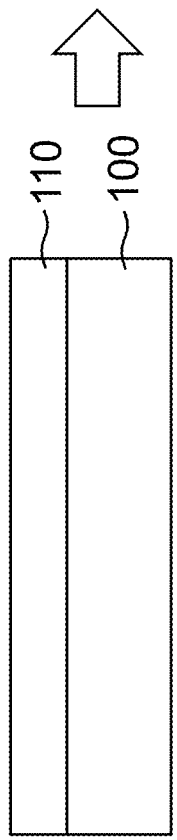
FIGS. 2, 3, 4, and 5 show operations of forming the heterostructure of FIG. 1.

FIGS. 2, 3, 4, and 5 show operations of forming the structure of the embodiment shown by FIG. 1. In FIG. 2, the first semiconductor layer 110 is formed over the substrate 100 by a deposition method, such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, or other suitable process. The first semiconductor layer 110 is formed to a thickness to reduce stress/strain in some embodiments. For example, but not limited to, the first semiconductor layer 110 is formed to have a thickness of 2 nm to 20 nm in some embodiments. The first semiconductor layer 110 includes a germanium layer, in some embodiments. Also, the first semiconductor layer 110 is doped by an n-type dopant to increase the charge carrier concentrations, and the n-type dopant includes phosphorus, in certain embodiments. The doping operation can be carried out by in-situ doping during deposition of the first semiconductor layer and/or ion implantation. In this way, the first semiconductor layer 110 can be a phosphorus doped germanium layer.

Figure 3:
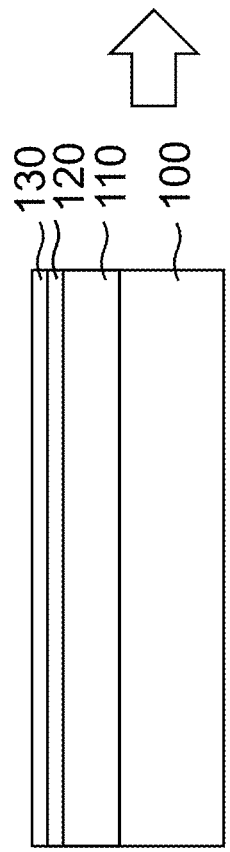

In FIG. 3, the first interfacial epitaxial layer 120 is formed on the first semiconductor layer 110 by vapor-phase epitaxy (VPE), chemical vapor deposition, molecular-beam epitaxy (MBE), liquid-phase epitaxy (LPE), atomic layer deposition (ALD) or other suitable methods. In some embodiments, the first interfacial epitaxial layer 120 includes the elements of the first semiconductor layer 110 and the second semiconductor layer 140. In some embodiments, the first interfacial epitaxial layer 120 is a SiGe layer disposed on the first semiconductor layer 110 of phosphorus doped germanium layer and disposed under the second semiconductor layer 140 of phosphorus doped silicon layer.

Also, the second interfacial epitaxial layer 130 is optionally formed on the first interfacial epitaxial layer 120 by vapor-phase epitaxy (VPE), chemical vapor deposition, molecular-beam epitaxy (MBE), liquid-phase epitaxy (LPE), atomic layer deposition (ALD) or other suitable methods. The second interfacial epitaxial layer 130 is formed by the same method as the first interfacial epitaxial layer 120 in some embodiments. In such a case, the second interfacial epitaxial layer 130 is continuously formed after the growth of the first interfacial epitaxial layer 120 in the same deposition chamber, in some embodiments. In other embodiments, the second interfacial epitaxial layer 130 is formed by a different method than the first interfacial epitaxial layer 120.

Figure 4:
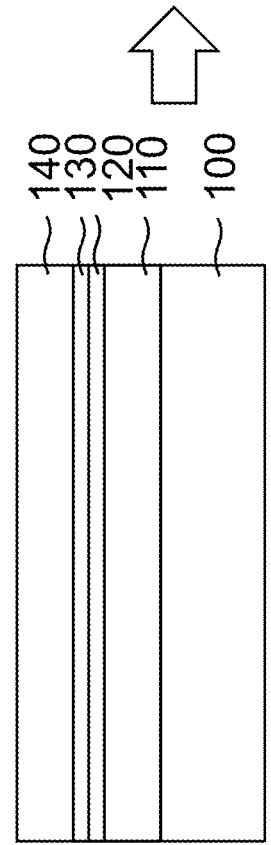

In FIG. 4, the second semiconductor layer 140 is formed on the second interfacial epitaxial layer 130 by a deposition method such as chemical vapor deposition (CVD), including low pressure CVD (LPCVD) and plasma enhanced CVD (PECVD), atomic layer deposition (ALD), physical vapor deposition (PVD), such as pulsed laser deposition (PLD), sputtering, evaporative deposition, or other suitable process. Each of the above interfacial epitaxial layers 120 and 130 and the second semiconductor layer 140 is formed in the same chamber as the first semiconductor layer 110, in some embodiments. In other embodiments, the second semiconductor layer 140 is formed in a different chamber than the first semiconductor layer 110, in some embodiments. The second semiconductor layer 140 is formed to a thickness to reduce stress/strain in the structure. For example, but not limited to, the second semiconductor layer 140 is formed to have a thickness of about 2 nm to about 20 nm in some embodiments. The second semiconductor layer 140 includes a silicon layer, in some embodiments. Also, the second semiconductor layer 140 is doped by an n-type dopant to increase the charge carrier concentrations, and the n-type dopant includes phosphorus, in certain embodiments. The doping operation can be carried out by in-situ deposition or ion implantation. In this way, the second semiconductor layer 140 can be a phosphorus doped silicon layer. The P doped Si layer can reduce contact resistance at the interface between the conducting metallic contact layer 150 and the second semiconductor layer 140.

Figure 5:
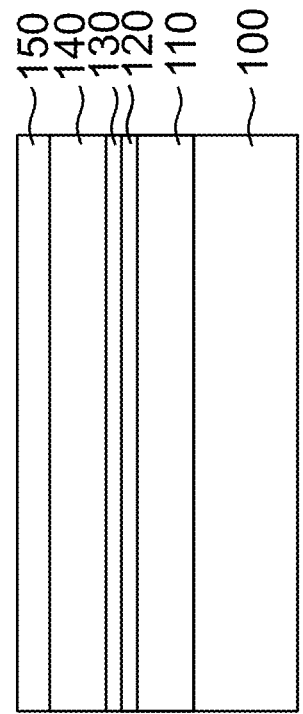

In FIG. 5, a conducting metallic contact layer 150 is formed over the substrate 100 by a deposition method, such as chemical vapor deposition (CVD), including low pressure CVD (LPCVD) and plasma enhanced CVD (PECVD), atomic layer deposition (ALD), physical vapor deposition (PVD) such as pulsed laser deposition (PLD), sputtering, evaporative deposition, cathodic arc deposition, e-beam physical vapor deposition, or other suitable process. The conducting metallic contact layer 150 is formed of a conducting metal layer or an electrically conducting layer including an element other than a metal, including one or more of Co, Ni, W, Ti, Ta, Cu, Al, Mo, TiN, TaN, WSi$_2$, Ni—Si, Co—Si, WN, TiAlN, TaCN, TaC, TaSiN, metal alloys such as Ti—Al alloy, Al—Cu alloy, other suitable materials, and/or combinations thereof.

Figure 6:
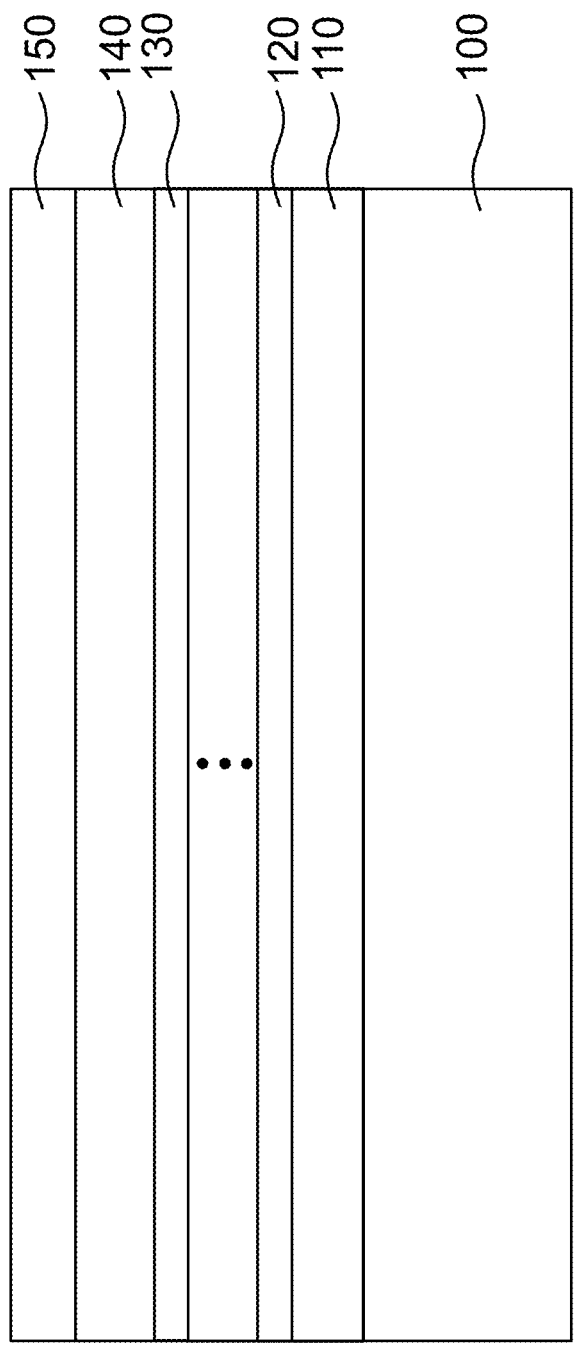
FIG. 6 shows another heterostructure used in a semiconductor device, according to another embodiment of the present disclosure.

FIG. 6 shows another heterostructure or semiconductor stacked structure used in a semiconductor device according to another embodiment of the present disclosure. In FIG. 6, there are more than two interfacial layers between the first semiconductor layer 110 and the second semiconductor layer 140. In the embodiment of FIG. 6, between the first semiconductor layer 110 and the second semiconductor layer 140, two or more other interfacial epitaxial layers having the same or different amounts of constituent elements Si or Ge as the first and second interfacial epitaxial layers 120 and 130 are formed. Also, for example, but not limited to, between the first semiconductor layer 110 and the second semiconductor layer 140, a superlattice structure of 130 on 120 on 130 on 120, etc. is formed. The superlattice structure can also be written in a form of 130/(120/130)$_N$/120, where N is a natural number indicating the number of double-layers. Alternatively, a stacked structure of 130 on 130 on 120 on 120 (or 130/130/120/120) is formed in some embodiments. A mixed structure of 130$_M$/(120/130)$_N$/120$_M$ can also be formed, where M is a natural number that can be the same as or different from N. Also, multilayers having modified compositions 130/ . . . 123/133/122/132/121/131/120 with layers 121, 122, 123, etc. having varied compositions compared with the composition of the interfacial epitaxial layer 120 as formed in some embodiments. Similarly, the interfacial epitaxial layers 131, 132, 133, etc. have varied compositions compared with the composition of the interfacial epitaxial layer 130 in some embodiments. A compositional grading structure can also be formed using this multi-layered structure, such as, for example, the amount of Si increases from the interfacial epitaxial layer 120 toward the interfacial epitaxial layer 130, and the amount of Ge decreases from the interfacial epitaxial layer 120 toward the interfacial epitaxial layer 130. Also, in some embodiments, the interfacial epitaxial layer 120 or 130 has a composition gradually changing along a thickness direction of the interfacial epitaxial layer. Any combination of any number of additional interfacial layers 120 or 130 is inserted between the first interfacial epitaxial layer 120 and the second interfacial epitaxial layer 130, as understood by one of ordinary skill in the art. This modification of inserting additional interfacial layers in any stacking sequence or compositional combination applies to any of the embodiments disclosed herein.

Figure 7:
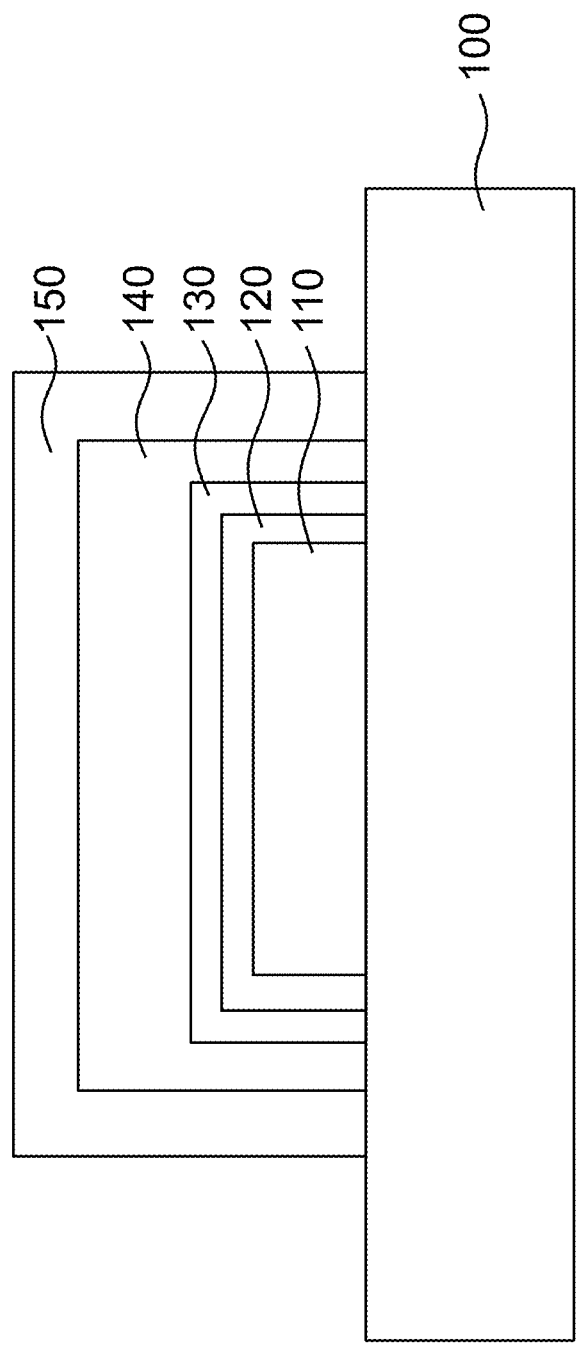
FIG. 7 shows another heterostructure used in a semiconductor device, according to another embodiment of the present disclosure.

FIG. 7 shows another heterostructure or semiconductor stacked structure used in a semiconductor device, according to another embodiment of the present disclosure. The heterostructure includes a patterned first semiconductor layer 110, a first interfacial epitaxial layer 120, a second interfacial epitaxial layer 130, a second semiconductor layer 140, and a conducting metallic contact layer 150. The first interfacial layer 120 is disposed on and completely covers the upper and side faces of the patterned first semiconductor layer 110, and contacts the substrate 100. The second interfacial layer 130 is disposed on and completely covers the upper and side faces of the first interfacial layer 110, and contacts the substrate 100. The second semiconductor layer 140 is disposed on and completely covers the upper and side faces of the second interfacial layer 130, and contacts the substrate 100. The conducting metallic contact layer 150 is disposed on and completely covers the upper and side faces of the second semiconductor layer 140, and contacts the substrate 100.

In FIG. 7, the heterostructure is disposed on the substrate 100 formed of the same materials described above relating to the embodiments of FIG. 1 or 6. The materials used to form the layers 110, 120, 130, 140, and 150 are described above relating to the embodiments of FIG. 1 or 6 and will not be repeatedly described.

Figure 8:
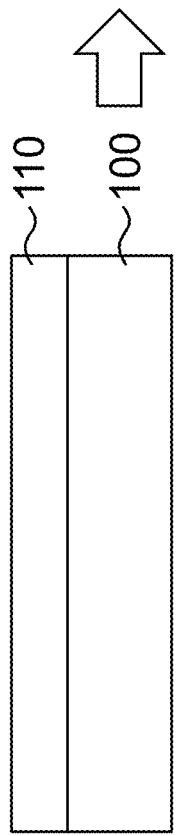
FIGS. 8, 9, 10, 11, 12, and 13 show operations of forming the heterostructure of FIG. 7.
Figure 9:
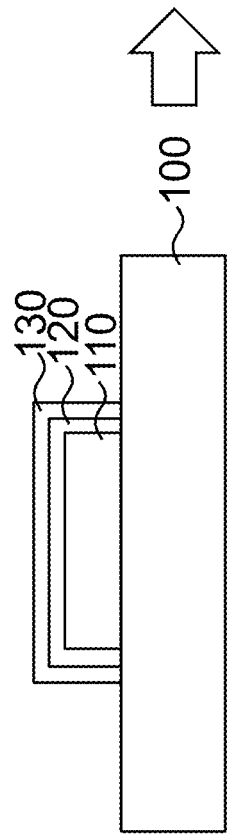

FIGS. 8, 9, 10, 11, 12, and 13 show operations of forming the heterostructure of FIG. 7. FIG. 8 shows the substrate 100. In FIG. 9, the first semiconductor layer 110 is formed over the substrate 100 by a deposition method, such as chemical vapor deposition (CVD), including low pressure CVD (LPCVD) and plasma enhanced CVD (PECVD), atomic layer deposition (ALD), physical vapor deposition (PVD) such as pulsed laser deposition (PLD), sputtering method, evaporative deposition, or other suitable process. Also, the first semiconductor layer 110 can be formed by an epitaxy method, such as vapor-phase epitaxy (VPE), molecular-beam epitaxy (MBE), atomic layer deposition (ALD) and liquid-phase epitaxy (LPE). The first semiconductor layer 110 is formed to a thickness to reduce stress/strain in the structure. For example, but not limited to, the first semiconductor layer 110 is formed to a thickness of 2 nm to 20 nm in some embodiments. In some embodiments, the first semiconductor layer 110 is formed of a semiconductor doped with a dopant by an in-situ deposition method or by an ion implantation method.

Figure 10:
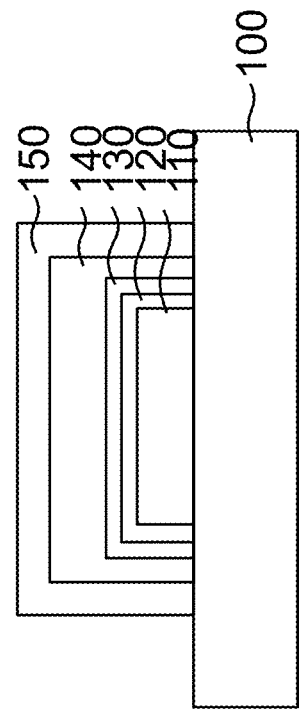
Figure 13:
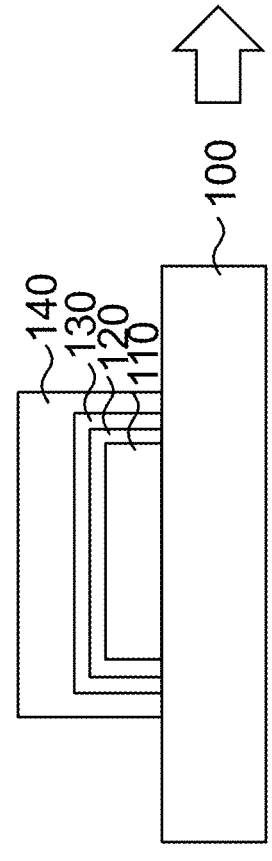

In FIG. 10, the first semiconductor layer 110 formed in the operation shown in FIG. 13 is patterned by photolithographic etching method. The dimension of the patterned first semiconductor layer 110 is tailored for device components such as an electrode line of a memory device, such as a bit line or a word line of a random access memory (RAM), or a source/drain portion of a planar or non-planar (e.g., fin) transistor.

Figure 11:
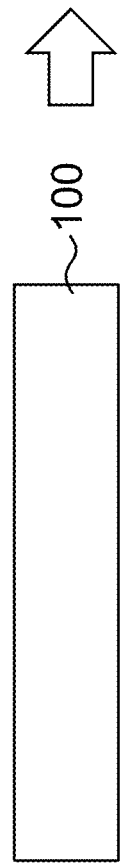

In FIG. 11, the first interfacial epitaxial layer 120 is formed on the substrate 100 by vapor-phase epitaxy (VPE), chemical vapor deposition, molecular-beam epitaxy (MBE), liquid-phase epitaxy (LPE), atomic layer deposition (ALD) or other suitable methods. The second interfacial epitaxial layer 130 is also disposed on the first semiconductor layer 110. The second interfacial epitaxial layer 130 is formed on the first interfacial epitaxial layer 120 by any of the above epitaxy methods. In some embodiments, the second interfacial epitaxial layer 130 is formed by the same method as the first interfacial epitaxial layer 120. In such a case, the second interfacial epitaxial layer 130 is continuously formed after the growth of the first interfacial epitaxial layer 120 in the same deposition chamber. Also, the second interfacial epitaxial layer 130 is formed by a different method than the first interfacial epitaxial layer 120. The formed first and second interfacial layers 120 and 130 are patterned by photolithographic and etching methods.

Figure 12:
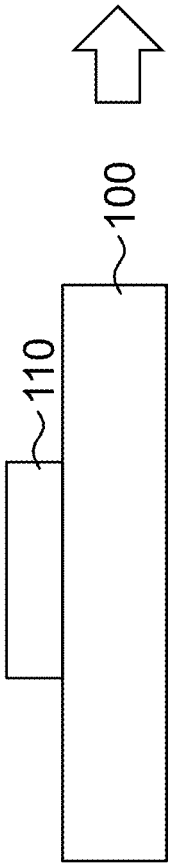

In FIG. 12, the second semiconductor layer 140 is formed on the substrate 100 by any of the above described methods and techniques used for deposition and doping of the first semiconductor layer 110. The formed second semiconductor layer 140 is patterned by photolithographic and etching methods including UV photolithography, to remove the portions contacting the substrate 100 but not removing portions covering the second interfacial epitaxial layer 130, as shown in FIG. 12.

In FIG. 13, a conducting metallic contact layer 150 is formed on the substrate 100 by a deposition method, such as chemical vapor deposition (CVD), including low pressure CVD (LPCVD) and plasma enhanced CVD (PECVD), atomic layer deposition (ALD), physical vapor deposition (PVD) such as pulsed laser deposition (PLD), sputtering, evaporative deposition, cathodic arc deposition, e-beam physical vapor deposition or other suitable process. The conducting metallic contact layer 150 formed on the second semiconductor layer 140 is patterned by photolithographic and etching methods to remove the portions contacting the substrate 100 and not covering the second interfacial epitaxial layer 140, as shown in FIG. 13.

Figure 14:
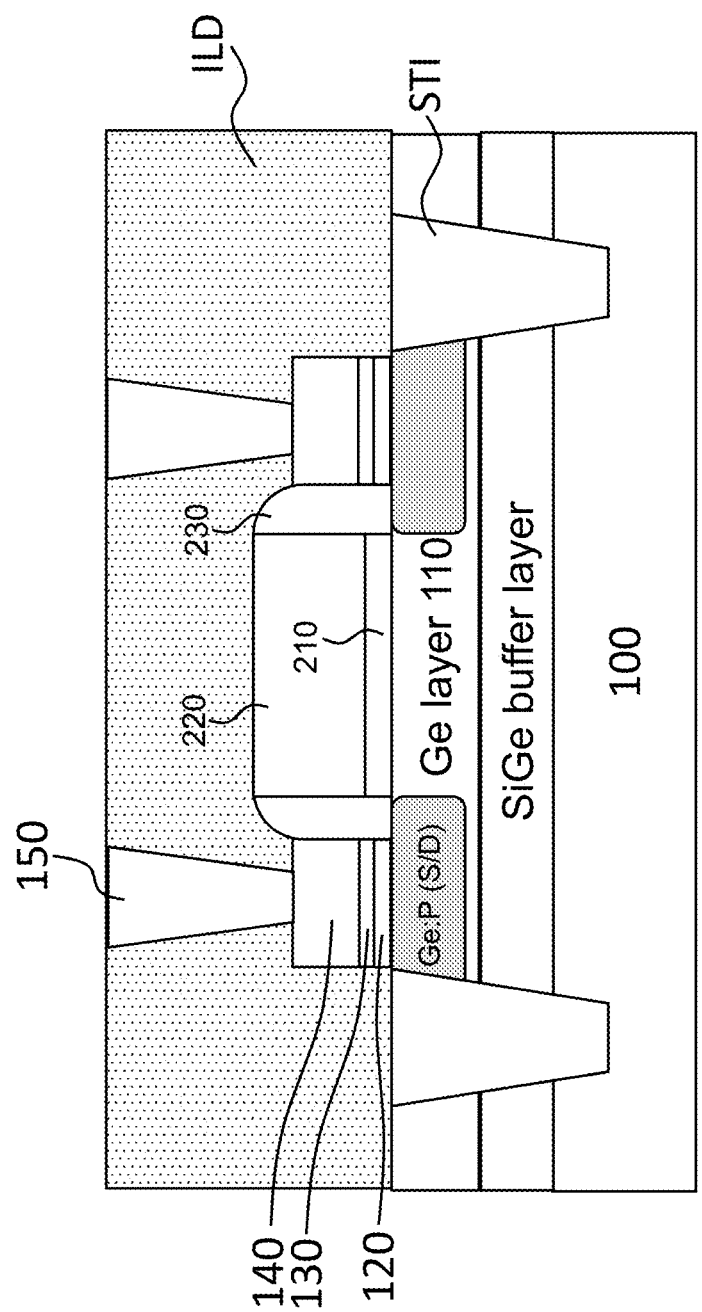
FIG. 14 shows a planar transistor device used in a semiconductor device, according to an embodiment of the present disclosure.

FIG. 14 shows a planar transistor device used in a semiconductor device, according to an embodiment of the present disclosure. In FIG. 14, the planar transistor is formed on a substrate 100 formed of any of the above described materials relating to the embodiment of FIG. 1. The planar transistor includes a germanium layer 110 for a germanium channel for charge carrier transport in the transistor. The germanium layer 110 is disposed on a SiGe buffer layer on the substrate 100. The germanium layer 110 includes diffusion regions (indicated as "Ge:P (S/D)" which stands for phosphorus doped germanium source/drain region) as source and drain regions of the transistor. The diffusion regions are formed by doping the germanium layer 110 by ion implantation. The planar transistor further includes an isolation insulating layer which is also called a shallow trench isolation (STI) layer. The isolation insulating layer is made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these.

The planar transistor further includes a second interfacial epitaxial layer 130 stacked on a first interfacial epitaxial layer 120 which is disposed on the Ge:P S/D region. The planar transistor further includes a second semiconductor layer 140 disposed on the second interfacial epitaxial layer 130.

Between the source and drain regions, the planar transistor includes a gate stack which is formed of a gate dielectric layer 210 on the germanium layer 110 at a channel region between the Ge:P S/D regions, and a gate electrode layer 220. The gate electrode layer 220 may be a single layer or multilayer structure. In the present embodiment, the gate electrode layer 220 is poly-silicon. Further, the gate electrode layer 220 is doped poly-silicon with uniform or non-uniform doping, in some embodiments. In some alternative embodiments, the gate electrode layer 220 include a metal, such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 220 has a thickness in a range of 20 nm to 100 nm.

In some embodiments, the gate dielectric layer 210 includes silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In the present embodiment, the gate dielectric layer 210 is a high-k dielectric layer with a thickness in the range of about 1 to about 5 nm. The gate dielectric layer 210 may further include an interfacial layer (not shown) to reduce damage between the gate dielectric layer 210 and channel of the first semiconductor layer 110. The interfacial layer includes silicon oxide in some embodiments.

The gate stack is surrounded by sidewall spacers 230 which separates the gate stack from the source and drain regions. The sidewall spacers 230 includes one or more of SiN, SiON, SiCN, SiCO, SiOCN or any other suitable dielectric material.

The planar transistor is covered by an interlayer dielectric (ILD) layer in which through holes are formed, and contacts 150 are formed by filling the through holes with conductive material. The materials for the ILD layer include compounds comprising Si, O, C and/or H, such as silicon oxide, SiCOH and SiOC. Organic materials, such as polymers, may be used for the ILD layer. The materials used to form the layers 120, 130, 140, and 150 are any of the materials described above for the other embodiments (e.g. the embodiment in FIG. 7) of the present disclosure.

FIGS. 15, 16, 17, 18, 19, 20, and 21 show operations of forming the planar transistor device of FIG. 14. In FIG. 15, a first semiconductor layer 110 which is a germanium layer for a germanium channel for charge carrier transport of the transistor is formed on a SiGe buffer layer on the substrate 100. Then, shallow trench isolation (STI) layers, which are also called isolation insulating layers, are formed through a process such as CVD, flowable CVD (FCVD), or a spin-on-glass process, although any acceptable process may be utilized.

A gate stack is formed on the first semiconductor layer 110, and the gate stack includes gate dielectric layer 210 and gate electrode layer 220. The gate dielectric layer 210 is formed using a suitable process such as physical vapor deposition (PVD), chemical vapor deposition (CVD), atomic layer deposition (ALD), thermal oxidation, UV-ozone oxidation, or combinations thereof. The gate electrode layer 220 can be formed by using CVD, including LPCVD and PECVD, PVD, ALD, or other suitable process. The formed gate electrode layer 220 and the gate dielectric layer 210 are patterned by photolithographic and etching methods.

FIG. 16 shows an operation to form diffusion regions (indicated as "Ge:P (S/D)" which stands for phosphorus doped germanium source/drain region) at source and drain regions in the germanium layer 110. The potential wells are formed by doping the germanium layer 110 by ion implantation, and using the gate electrode layer 220 as a mask, in some embodiments. The potential wells are also formed by doping the germanium layer 110 during an epitaxial process in which phosphorus is co-flowed with $GeH_4$ or $Ge_2H_6$ during MOCVD, in some embodiments. The dopant concentration is in a range from about $5\times10^{17}$ to about $5\times10^{19}$ $cm^{-3}$ in some embodiments.

FIG. 17 shows an operation of forming the sidewall spacer 230 surrounding the gate stack. The sidewall spacer 230 can be formed by ALD or CVD, or any other suitable method.

FIG. 18 shows an operation of forming the first interfacial epitaxial layer 120 and second interfacial epitaxial layer 130 on the first semiconductor layer 110 by an epitaxy method such as, vapor-phase epitaxy (VPE), chemical vapor deposition, molecular-beam epitaxy (MBE), liquid-phase epitaxy (LPE), atomic layer deposition (ALD) or other suitable methods.

FIG. 19 shows an operation of forming a second semiconductor layer 140 on the second interfacial epitaxial layer 130 by CVD, including LPCVD and PECVD, PVD, ALD, or other suitable process, such as epitaxy methods including vapor-phase epitaxy (VPE), chemical vapor deposition, molecular-beam epitaxy (MBE), liquid-phase epitaxy (LPE).

FIG. 20 shows an operation of forming an interlayer dielectric (ILD) layer over the embodiment of FIG. 19 by deposition techniques, such as chemical vapor deposition (CVD) including LPCVD (low pressure chemical vapor deposition), plasma-CVD and flowable CVD, pulsed laser deposition (PLD) such as pulsed laser deposition or a sputtering method such as radio frequency (rf)-sputtering, and atomic layer deposition (ALD).

FIG. 21 shows an operation of etching the ILD layer by photolithographic and etching methods to form two through holes at the source and drain regions of the transistor. A conducting metallic contact layer 150 is formed by filling the through holes.

Figure 22B:
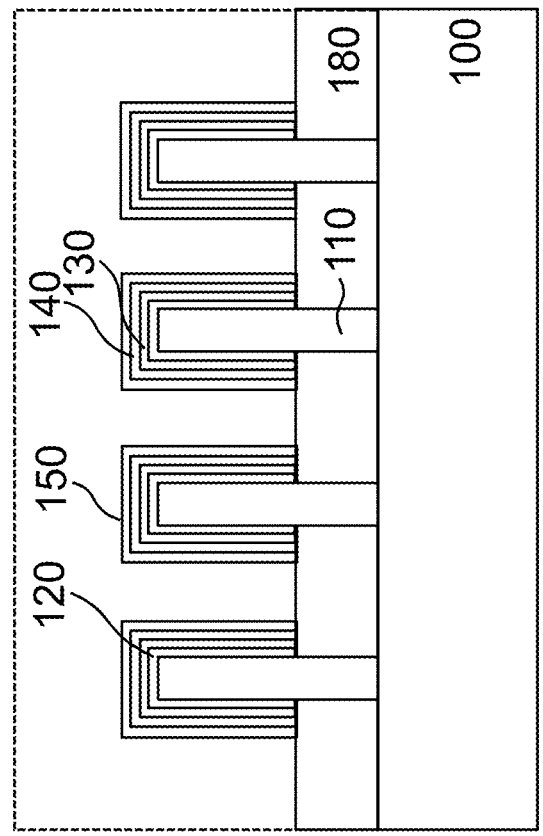
FIG. 22($a$) shows a cross-sectional view of a fin structure for a finFET (fin field effect transistor) device that can be used in a semiconductor device, according to an embodiment of the present disclosure, and the view is obtained by cutting along a gate stack of the finFET device.
Figure 22A:
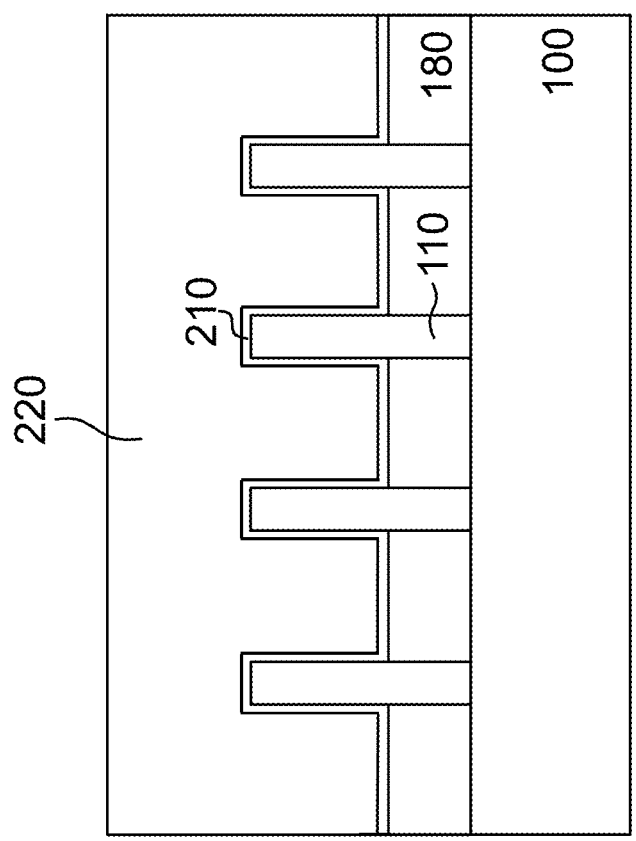

FIGS. 22(a) and 22(b) show side views, by cutting through a gate stack and by cutting through a source/drain region, respectively, of a finFET (fin field effect transistor) device used in a semiconductor device, according to an embodiment of the present disclosure. The fin structure is formed on a substrate 100 formed of any of the materials described above in relation to FIG. 1. The fin structure includes a first semiconductor layer 110, a first interfacial epitaxial layer 120, a second interfacial epitaxial layer 130, a second semiconductor layer 140, and a contact layer 150 sequentially formed over the fin structure 110. An insulating layer 180 is disposed between the fin structures (first semiconductor layers) 110. The fin structures 110 protrude from the substrate 100. The materials used to form the layers 110, 120, 130, 140, 150 and 180 can be any of the materials used to form the layers 110, 120, 130, 140, and 180 in the embodiment of FIG. 14. For indication purpose, in FIG. 22(b), the position of the gate stack is shown using dotted line.

The finFET also includes a gate electrode layer 220 formed on a gate dielectric layer 210 as shown in FIG. 22(a).

In at least one embodiment, the gate electrode layer 220 covers the upper portion (channel region) of more than one fin of the first semiconductor layer 110. The final transistor is a multi-fin transistor or, in some alternative embodiments, each of the upper portions of the first semiconductor layer 110 is used to form a separate finFET. In some embodiments, the gate electrode layer 220 includes a single layer or multilayer structure. In some embodiments, the gate electrode layer 220 includes poly-silicon. Further, the gate electrode layer 220 is doped poly-silicon with uniform or non-uniform doping, in other embodiments. In some alternative embodiments, the gate electrode layer 220 includes a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 220 has a thickness in the range from about 20 nm to about 100 nm.

Figure 23:
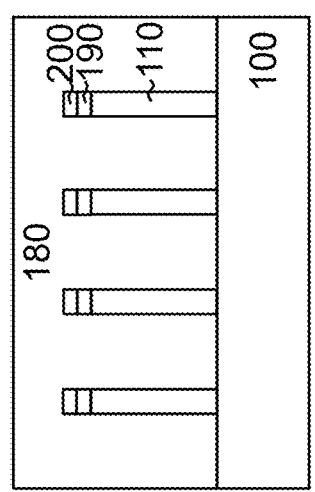
FIGS. 23, 24, 25, 26, 27, 28, 29, 30 and 31 show operations of forming the fin structure of FIGS. 22($a$) and 22($b$).

FIGS. 23, 24, 25, 26, 27, 28, 29, 30, and 31 show operations of forming the finFET of FIGS. 22(a) and 22(b). FIG. 23 shows the first and second mask layers 190 and 200 are formed over the first semiconductor layer 110. The first mask layer 190 is a pad oxide layer made of a silicon oxide, which can be formed by a thermal oxidation. The second mask layer 200 is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. A photoresist layer (not shown) is formed and patterned on the mask layers 190 and 200. FIG. 23 shows the mask layers 190 and 200 patterned into a mask pattern by using patterning operations including photo-lithography and etching.

Figure 24:
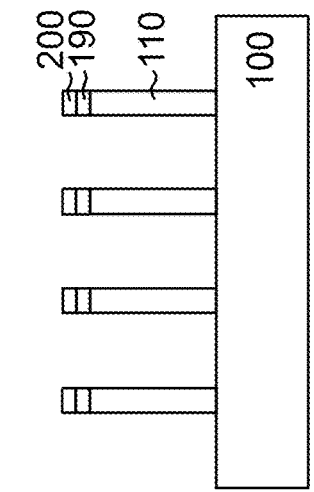

In FIG. 24, the first semiconductor layer 110 is patterned by any suitable method including one or more photolithography processes, including double-patterning or multi-patterning processes. The double-patterning or multi-patterning processes combine photolithography and self-aligned processes, allowing patterns to be created that have, for example, pitches smaller than what is otherwise obtainable using a single, direct photolithography process. The first semiconductor layer 110 is subsequently etched by a plasma dry and/or wet etching methods to form fin structures in some embodiments.

Figure 25:
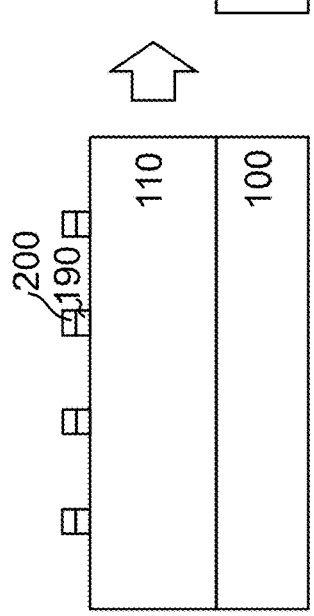

FIG. 25 shows an insulating layer 180 is formed over the entire fin structures by a deposition technique, such as chemical vapor deposition (CVD) including LPCVD (low pressure chemical vapor deposition), plasma-CVD and flowable CVD, pulsed laser deposition (PLD) such as pulsed laser deposition, or a sputtering method, such as radio frequency (rf)-sputtering, and atomic layer deposition (ALD).

Figure 26:
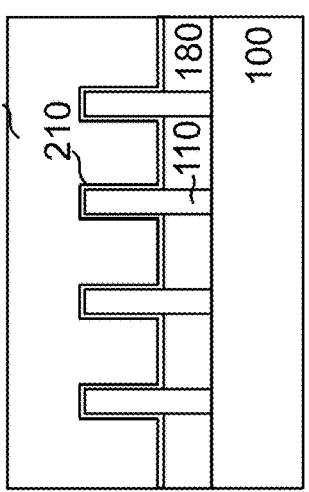
Figure 27:
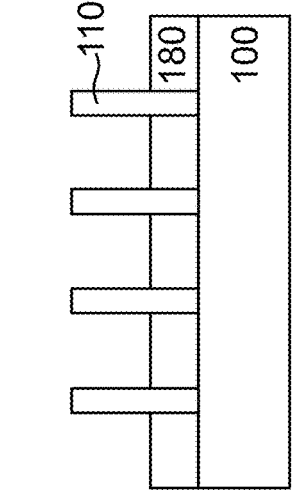

FIG. 26 shows a chemical and mechanical polishing (CMP) operation is carried out to remove the first and second mask layers 190 and 200. FIG. 27 shows a selective etching operation is carried out to reduce the thickness of the insulating layer 220 to expose the fin structure. The etching step is performed using a wet etching process, for example, by dipping the sample in FIG. 26 in hydrofluoric acid (HF) in some embodiments. In other embodiments, the etching step is performed using a dry etching process, for example, a dry etching process using $CHF_3$ or $CF_4$ as etching gases.

Figure 28:
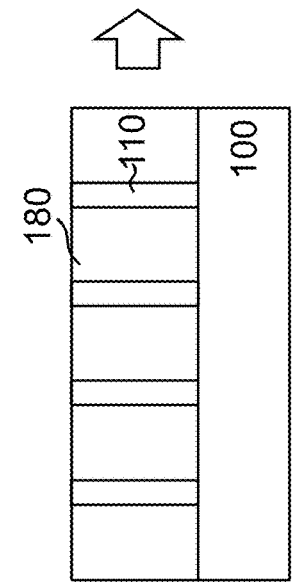

FIG. 28 is a cross sectional view cutting a gate structure and illustrates a gate stack formed over the fin structures of the first semiconductor layer 110. First, a gate dielectric layer 210 is formed over the fin structures, and then a gate electrode layer 220 is formed over the gate dielectric layer 210. Then, both layers of 210 and 220 are patterned to expose source and drain regions the fin structure of the first semiconductor layer 110. In some embodiments, the exposed fin structure (S/D regions) of the first semiconductor layer 110 undergoes a doping operation with a dopant such as an n-type dopant, including phosphorus to increase the number of charge carriers in the source and drain regions. The doping operation can be carried out by ion implantation.

In some embodiments, the gate dielectric layer 210 includes silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In the present embodiment, the gate dielectric layer 210 is a high-k dielectric layer with a thickness in a range from about 1 to about 5 nm. The gate dielectric layer 210 is formed using a suitable process such as physical vapor deposition (PVD), chemical vapor deposition (CVD), atomic layer deposition (ALD), thermal oxidation, UV-ozone oxidation, or combinations thereof. The gate dielectric layer 210 may further comprise an interfacial layer (not shown) to reduce damage between the gate dielectric layer 210 and channel fin of the first semiconductor layer 110. The interfacial layer may comprise silicon oxide.

The gate electrode layer 220 is formed over the gate dielectric layer 210 using a suitable process, such as chemical vapor deposition (CVD), including low pressure CVD (LPCVD) and plasma enhanced CVD (PECVD), physical vapor deposition (PVD), atomic layer deposition (ALD), or other suitable process, electroplating, or combinations thereof.

Figure 29:
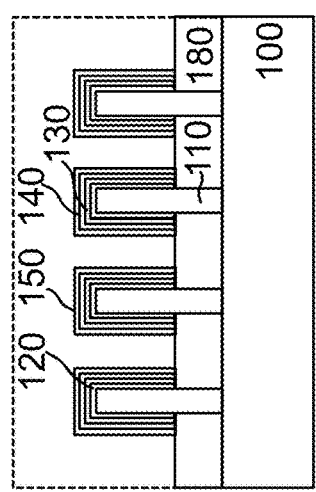
Figure 30:
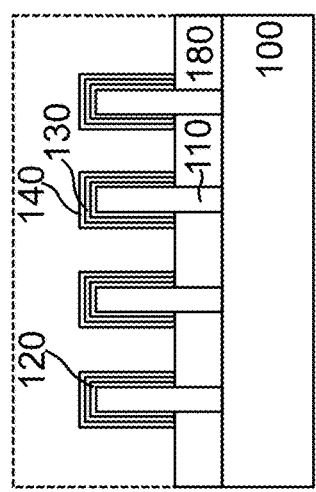
Figure 31:
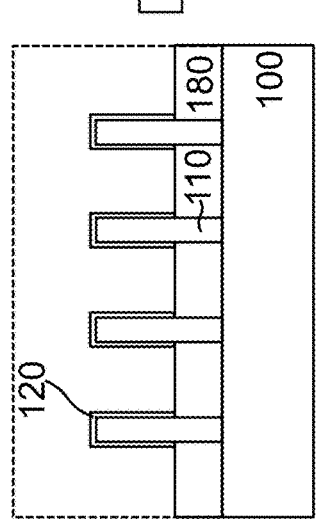

FIGS. 29, 30, and 31 show operations at a cross-sectional line at the source/drain region which is away from the gate stack region. For indication purpose, the position of the gate stack is shown using dotted line.

FIG. 29 shows a cross sectional view cutting the source/drain regions and illustrates that a first interfacial epitaxial layer 120 is grown on the exposed fin structure (S/D regions) and over the insulating layer 180. In some embodiments, the first interfacial epitaxial layer 120 is selectively grown over the exposed fin structure and is not formed on the insulating layer 180. The first interfacial epitaxial layer 120 is grown to have a thickness of about 1 nm to about 3 nm, and is grown by vapor-phase epitaxy (VPE), chemical vapor deposition, molecular-beam epitaxy (MBE), liquid-phase epitaxy (LPE), atomic layer deposition (ALD) or other suitable methods in some embodiments. The range of thickness of the first interfacial epitaxial layer 120 is limited by the pitch between the fins. That is, if the fin pitch is too small, the first interfacial epitaxial layer 120 cannot be formed into a thick film.

FIG. 30 shows an operation of forming a second interfacial epitaxial layer 130 on the first interfacial epitaxial layer 120 to a thickness of about 1 nm to about 3 nm, and is grown by vapor-phase epitaxy (VPE), chemical vapor deposition, molecular-beam epitaxy (MBE), liquid-phase epitaxy (LPE) or other suitable methods. The range of total thickness of the first interfacial epitaxial layer 120 and the second interfacial epitaxial layer 130 is limited by the pitch between the fins. That is, if the fin pitch is too small, the first interfacial epitaxial layer 120 or the second interfacial epitaxial film 130 cannot be formed into a thick film. Also, a second semiconductor layer 140 is formed on the second interfacial epitaxial layer 130. The second semiconductor layer 140 can be formed by any one of the methods used for deposition and doping of the first semiconductor layer 110.

FIG. 31 shows an operation of forming a contact layer or a conductive layer 150 over the second semiconductor layer 140. The contact layer 150 is formed over the substrate 100 by a deposition method, such as chemical vapor deposition (CVD), including low pressure CVD (LPCVD) and plasma enhanced CVD (PECVD), atomic layer deposition (ALD), physical vapor deposition (PVD) such as pulsed laser deposition (PLD), sputtering, evaporative deposition, cathodic arc deposition, e-beam physical vapor deposition, or other suitable process.

For the purpose of evaluation the quality of interface between Ge and Si in the heterostructure or the semiconductor stacked layer fabricated according to the above embodiments, the sheet resistance is measured by a four-point probe method in which two probes with a gap spacing g of a voltmeter are applied to a surface of a sample while one of the probes for applying a DC current contacts a point of the surface at a gap spacing g to the left of the left probe of the voltmeter and the other one of the probes for applying the DC current to the surface contacts another point of the surface at a gap spacing g to the right of the right probe of the voltmeter. When the thickness of the measured layer or the total thickness of the measured layers is much smaller than the planar size of the measured surface, the sheet resistance in units of $\Omega/\square$ is proportional to the measured voltage V divided by the applied current I. In other words, the linearly-fitted slope of a plot of V versus I, when multiplied by a correction factor, results in the sheet resistance, and resistivity is obtained by multiplying the sheet resistance with the thickness of the measured layer or multilayer.

Samples subject to the four-point probe method include phosphorus doped germanium (Ge:P), phosphorus doped silicon (Si:P) on Ge:P, $Se_{1-x}Ge_x$ (x=0.4-0.7) layer on Ge:P, two $Se_{1-x}Ge_x$ (x=0.4-0.7) layers of different compositions on Ge:P, Si:P on $Se_{1-x}Ge_x$ (x=0.4-0.7) layer on Ge:P, Si:P on two $Se_{1-x}Ge_x$ (x=0.4-0.7) layers of different compositions on Ge:P, TiN on Si:P on Ge:P, TiN on Si:P on a $Se_{1-x}Ge_x$ (x=0.4-0.7) layer on Ge:P, and TiN on Si:P on two $Se_{1-x}Ge_x$ (x=0.4-0.7) layers of different compositions on Ge:P.

Figure 32A:
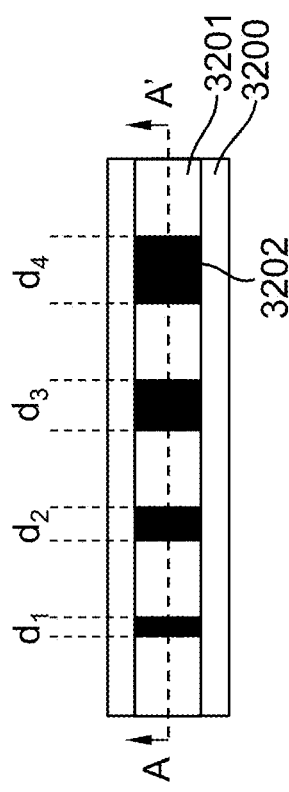
FIG. 32($a$) shows a test structure of a linear transmission line model (linear TLM) simulation for measuring a contact resistivity of an embodiment of the present disclosure, and FIG. 32($b$) shows a setup for measuring the contact resistivity.
Figure 32B:
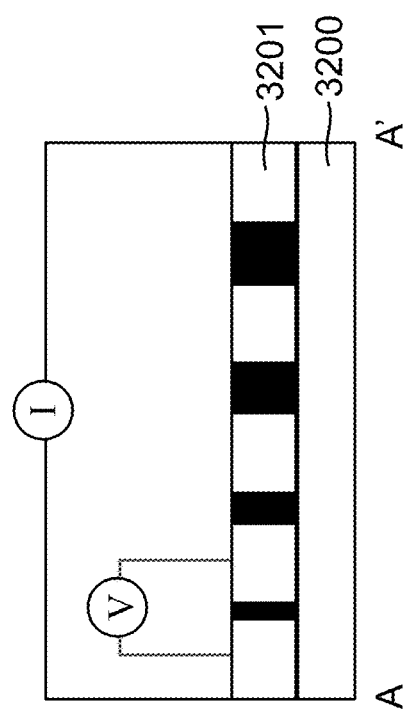

To measure the contact resistivity, a linear transmission line model (linear TLM) is used, in some embodiments. The method is used to measure sheet resistance and contact resistance. FIGS. 32(a) and 32(b) show the linear transmission line model test structure. In the test structure, phosphorus doped germanium layer or phosphorus doped germanium substrate 3200 is first formed. Then, the phosphorus doped silicon layer is formed and patterned to be patterned layers 3201 in some embodiments. Also, in some embodiment, the pattern layer 3201 is a phosphorus doped silicon layer (Si:P) on a $Se_{1-x}Ge_x$ (x=0.4-0.7) layer, a phosphorus doped silicon layer (Si:P) on two $Se_{1-x}Ge_x$ (x=0.4-0.7) layers of different compositions, TiN on Si:P, TiN on Si:P on a $Se_{1-x}Ge_x$ (x=0.4-0.7) layer, and TiN on Si:P on two $Se_{1-x}Ge_x$ (x=0.4-0.7) layers of different compositions.

In the linear TLM test structure, the pattern layers 3201 are formed to have the same size, in some embodiments. The gap spacings $d_1$, $d_2$, $d_3$, and $d_4$ between the pattern layers are formed to be different so as to provide data points for linear fitting. An insulating material is deposited to fill the gaps as insulating layers 3202 between adjacent pattern layers 3201. The insulating layer 3202 is composed of, but not limited to, silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. The insulating layer 3202 disposed over the germanium layer 3200 is an electrical and thermal insulator, and has a thickness in a range from about 5 to about 350 nm in some embodiments.

A linearly-fitted plot of measured resistances versus measured gap spacings $d_1$, $d_2$, and $d_3$ can be obtained, and the extrapolation results in y-intercept value of two times contact resistance. Because of the various gap spacings $d_1$, $d_2$, and $d_3$, this linear transmission line model (TLM) method is less sensitive to misalignment and is more suitable for non-uniform contact resistances. However, this linear transmission line model can be affected by parasitic current in regions not isolated by the insulating material filling the gap spacings $d_1$, $d_2$, and $d_3$.

Figure 33A:
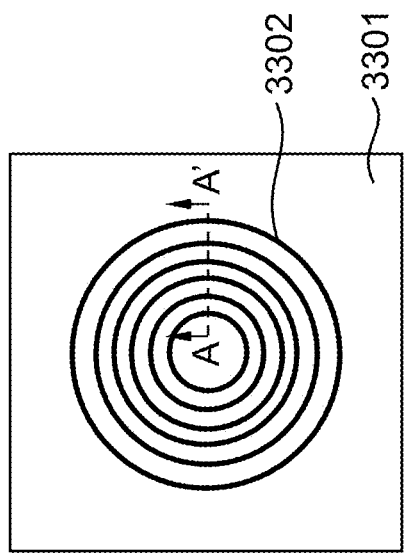
FIG. 33($a$) shows a test structure of a circular transmission line model (circular TLM) simulation for measuring a contact resistivity of an embodiment of the present disclosure, and FIG. 33($b$) shows a setup for measuring the contact resistivity.
Figure 33B:
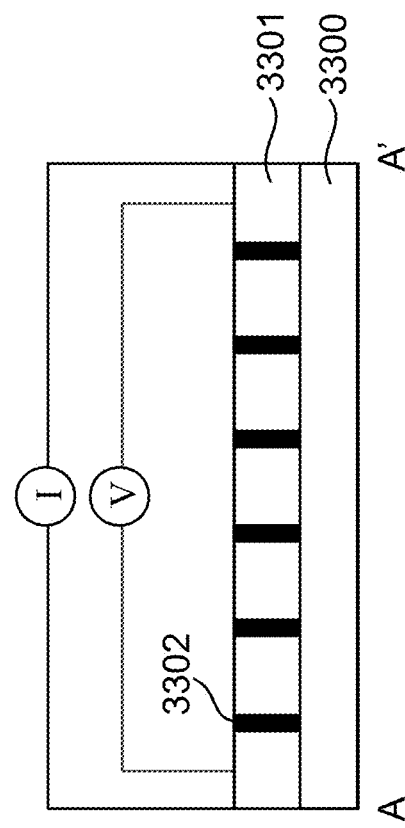

FIGS. 33(a) and 33(b) show another test structure for a circular transmission line model (circular TLM) method. In the test structure of circular TLM, a phosphorus doped germanium layer 3300 is formed and the phosphorus doped silicon layer is patterned to have pattern layers 3301 and concentric ring grooves filled with an insulating material 3302 in some embodiments. Also, in some embodiments, the pattern layer 3301 is a phosphorus doped silicon layer (Si:P) on a $Se_{1-x}Ge_x$ (x=0.4-0.7) layer, a phosphorus doped silicon layer (Si:P) on two $Se_{1-x}Ge_x$ (x=0.4-0.7) layers of different compositions, TiN on Si:P, TiN on Si:P on a $Se_{1-x}Ge_x$ (x=0.4-0.7) layer, and TiN on Si:P on two $Se_{1-x}Ge_x$ (x=0.4-0.7) layers of different compositions.

In the circular ring gap spacings between the patterns, an insulating material is deposited to fill the gap spacings to form insulating ring patterns 3302. The insulating ring patterns 3302 are formed to have same width and have same spacing from adjacent rings 3302. Thus, circular TLM has a higher precision requirement than linear TLM in some embodiments. The insulating ring patterns 3302 are composed of, but not limited to, silicon oxide ($SiO_2$), silicon nitride ($Si_3N_4$), silicon oxynitride (SiON), SiOCN, SiCN, $Al_2O_3$, fluorine-doped silicate glass (FSG), a low-k dielectric material, or various other suitable dielectric materials used in manufacturing semiconductor devices. The insulating ring pattern 3302 disposed over the germanium layer 3300 is an electrical and thermal insulator, and has a thickness in a range from about 5 to about 350 nm in some embodiments. In the circular TLM test structure, the conducting patterns 3301 are completely isolated from each other by insulating ring patterns 3302 and parasitic current along non-isolated regions does not occur. When the diameter D of the central pattern 3301 is much greater than the adjacent gap spacing d, the ring geometry can be reduced to a linear transmission line model and without perturbation by the parasitic current in non-isolated regions, with a correction factor of $C=(D/2d)\ln[(l_t+2d)/D]$, where $l_t$ is the resistance-spacing linear-fit's x-intercept value called 'transfer length', which is the carrier transfer distance in the measured sample.

The circular TLM method structures are used to measure the specific contact resistance of a metal on Si:P on Ge:P junction. Lowering the temperature from 390° C. to 350° C. decreases the contact resistance by 32%. Also, introducing the SiGe interfacial epitaxial layer further improves the contact resistance. Table 1 below shows the data obtained by evaluating the samples of the embodiments of the present disclosure.

TABLE 1

|  | $R_\square$ ($\Omega/\square$) | d (nm) | µ ($cm^2/Vs$) | Ns ($cm^{-3}$) |
|---|---|---|---|---|
| Si:P on Si | 335 | 10 | 31 | $5.5 \times 10^{20}$ |
| Si:P on Ge at 390° C. | Depleted | 19 | — | — |
| Si:P on Ge at 350° C. | 1,440 | 19 | 98 | $2.8 \times 10^{19}$ |
| Si:P/SiGe:P/Ge at 390° C. | 860 | 18 | 66 | $1.0 \times 10^{20}$ |
| Si:P/SiGe:P/Ge at 350° C. | 720 | 19 | 52 | $1.15 \times 10^{20}$ |
| Si:P/(SiGe:P)$_2$/Ge at 390° C. | 650 | 18 | 50 | $1.3 \times 10^{20}$ |

Table 1 shows that the sheet resistivity of the phosphorus doped silicon layer (thickness d of 10 nm) of on silicon substrate is measured to be about 335$\Omega/\square$ with a charge carrier mobility of 31 $cm^2/Vs$ and charge carrier concentration of $5.5 \times 10^{20}$ $cm^{-3}$. In the embodiments having phosphorus doped silicon layer formed on a germanium layer at 390° C., the charge carriers are completely depleted and the heterostructure acts like it has no charge carrier. When the Ge forming temperature is lowered to 350° C., the sheet resistivity is as high as 1440$\Omega/\square$. Inserting the phosphorus doped SiGe layer between the phosphorus doped silicon layer and the germanium layer formed at 390° C., the interfacial strain is relaxed and the sheet resistivity is lowered to 860$\Omega/\square$. At a Ge forming temperature of 350° C. with a phosphorus doped SiGe layer, the sheet resistivity is further decreased to 720$\Omega/\square$. With two layers of phosphorus doped SiGe at the interface of phosphorus doped silicon layer and germanium layer, the sheet resistivity is greatly decreased to a value close to phosphorus doped silicon on a silicon substrate level, i.e. about 650$\Omega/\square$.

Among the samples, epitaxy at 350° C. or at a temperature between 330° C. and 370° C., has a beneficial effect in resistance reduction compared with epitaxy at a temperature of 390° C. This result indicates that the use of one or more interfacial epitaxial layers made of SiGe and/or lowering the Ge layer epitaxy temperature beneficially reduces the contact resistance. Therefore, the epitaxy temperature of between 330° C. and 370° C., such as 350° C., is applied to any of the interfacial layers of the embodiments of the present disclosure. Using epitaxy at these temperatures can be applied to reduce or remove the trap levels and defects caused by stress provided at the interface, and to reduce contact resistance. The traps block the movement of charge carriers (electron or hole) and remarkably lower electronic device performance. This technique applies to tall and narrow fins such that the contact resistance at the top portion and the sidewall portions of the fin are reduced. The annealing of the first and second interfacial layers 120 and 130 can be carried out using a laser, such as an excimer laser at an output power of about 1 W. In some embodiments, the laser has a wavelength of about 308 nm with a pulse width in a range from 50 to 300 ns. The duration of laser annealing depends on the sample dimensions, a thick sample, for example, requires a longer time for the annealing process. The laser light can be emitted by a laser diode and in a form of a continuous wave (CW) laser or a pulsed laser with adjusted laser power per pulse to annealing without causing any ablation phenomenon. Laser annealing, however, only reduces the contact resistance at the top portion of a tall and narrow fin in FinFET but not the sidewall portions or the entire fin of the FinFET. The above technique of using SiGe interlayers and choosing the temperature of the interface during epitaxy provides a benefit of reduction of contact resistance of top and sidewall portions of the fin or the entire fin without using laser annealing.

Figure 34:
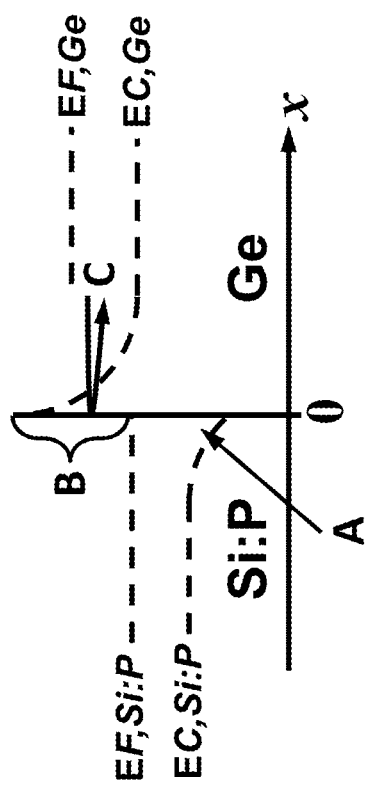
FIG. 34 shows an energy diagram of the interface of silicon and germanium according to an embodiment of the present disclosure.

FIG. 34 shows an energy diagram of the silicon and germanium interface. The silicon is doped with phosphorous to increase the number of charge carriers and to enhance the coupling between the metal contact and the silicon by inducing more charge carriers to tunnel through the potential barrier. In a device with a silicon/germanium interface, when bias voltage is applied, the phosphorus doped silicon has a Fermi level $E_{F,Si:P}$ and a conduction band edge $E_{C,Si:P}$ while the germanium has a Fermi level $E_{F,Ge}$ and a conduction band edge $E_{C,Ge}$. For the band bending of combining phosphorus doped silicon and germanium, at the interface of silicon and germanium located at 0 along the distance line x, there are 'dead pool' at the silicon side, indicated by label A in FIG. 34, of halted carriers due to effective barrier offset; tunneling barrier indicated by label B in FIG. 34, and bounced-back charge carriers due to reflection/refraction of 'slow' charge carriers with low mobility. The bouncing back of the 'slow' carriers is a dominant factor causing high interfacial resistivity at the silicon-germanium interface of the heterostructure. Therefore, reducing the interfacial resistivity on the n-type contact to Ge or SiGe CMOS device improves device performance and an efficient heterostructure or a transistor device, such as a finFET according to the present disclosure, has a low contact resistivity.

In a comparative method, when a silicon layer is formed on a germanium layer, a phosphorus doped germanium (Ge:P) prelayer having a thickness of 0.5 nm-2 nm is grown epitaxially on the germanium layer. Then, a phosphorus doped silicon (Si:P) layer is epitaxially grown on the Ge:P prelayer or directly on the germanium layer to prevent oxidation of the germanium layer as the phosphorus doped silicon layer has a function of a barrier between the germanium and titanium top contact layer, preventing formation of germanium-metal trap states. In this situation, the interface of Si:P and Ge:P can have a lattice mismatch as large as 4.2% which is likely to generate trap states and degrade contact resistivity of the silicon-germanium heterostructure. Also, the traps formed at the interface of silicon and germanium can lead to depletion of the Si:P grown on a planar Ge (as shown in the sheet resistivity measurement result of SiGe on Ge at 390° C. in Table 1 above).

Figure 35:
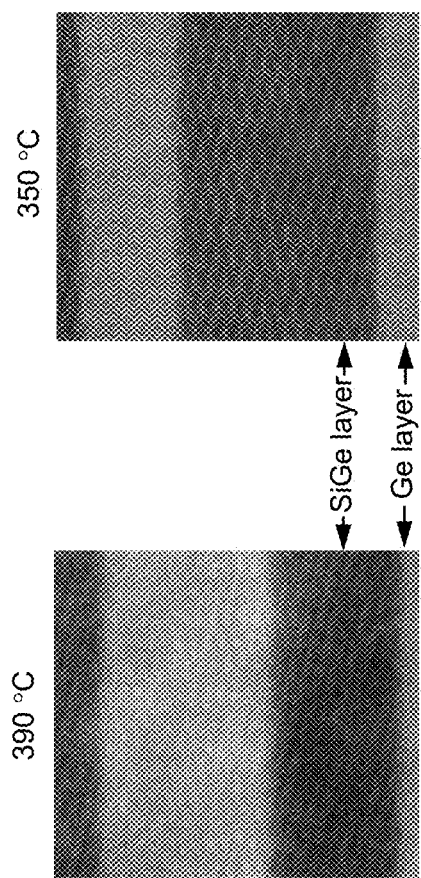
FIGS. 35($a$) and 35($b$) show embodiments of the present disclosure, demonstrating the effect of temperature on the interface of germanium and silicon-germanium.

In contrast, according to the present embodiments (see Table 1 above), lowering the temperature from 390° C. to 350° C. improves the situation of depletion. Also, inserting epitaxial layer of SiGe reduces the resistance. The epitaxial layer of SiGe functions to reduce the interfacial traps by making the interface well-defined and organized and adjusting the strain/stress. With a multi-layered structure or a superlattice of SiGe layers between the bottom Ge layer and the top Si:P layer, the resistance can be dramatically reduced, implying a drop of interfacial traps. FIGS. 35(a) and 35(b) show the transmission electron microscope (TEM) micrographs of samples of the embodiments of the present disclosure, demonstrating the effect of temperature on the interface of germanium and silicon-germanium. FIG. 35(a) shows that the interface of germanium and silicon-germanium formed at 390° C. is not clearly defined. FIG. 35(b) shows that the interface of germanium and silicon-germanium formed at 350° C. is clearly defined and organized. Therefore, lowering the temperature during formation of the heterostructure to a temperature of a range between 330° C. and 370° C., such as 350° C., promotes well-defined interface, organized interfacial structure, and interfacial properties.

Figure 36:
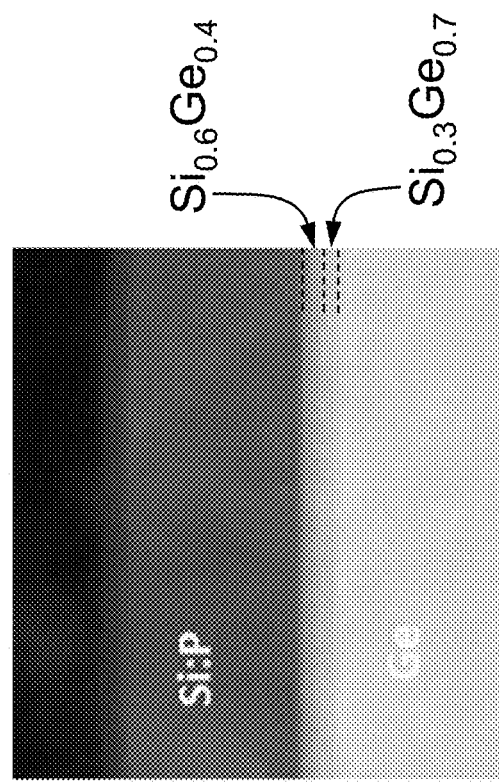
FIG. 36 shows the interfaces between the phosphorus doped silicon (Si:P) and germanium (Ge) layer of an embodiment of the disclosure.

FIG. 36 shows a TEM micrograph of an embodiment of the present disclosure showing the interfaces between the phosphorus doped silicon (Si:P) and germanium (Ge) layer. Between the Si:P layer and the Ge layer, there are three interfaces, namely the interface between the Si:P layer and a $Si_{0.6}Ge_{0.4}$ interfacial epitaxial layer, the interface between the $Si_{0.6}Ge_{0.4}$ interfacial epitaxial layer and a $Si_{0.3}Ge_{0.7}$ interfacial epitaxial layer, and the interface between the $Si_{0.3}Ge_{0.7}$ interfacial epitaxial layer and the Ge layer. All the interfaces are clearly well-defined, showing organized atomic structures. Each of the interfacial epitaxial layers of $Si_{0.6}Ge_{0.4}$ and $Si_{0.3}Ge_{0.7}$ has a thickness of about 1 to about 3 nm in some embodiments. The sheet resistance of the SiP—SiGe—Ge heterostructure in FIG. 36 is measured to be about 108Ω/□. Compared to the sheet resistance of 170Ω/□ for SiP—Ge structure, the two interfacial epitaxial layers largely reduce the contact resistance and enhance the device performance of a heterostructure or transistor devices having the heterostructure.

The present application discloses an exemplary method of manufacturing a heterostructure in a semiconductor device. The method includes operations of forming an interfacial epitaxial layer on a germanium layer disposed over a substrate, forming a semiconductor layer on the interfacial epitaxial layer, and forming a conductive layer on the semiconductor layer. The interfacial epitaxial layer contains germanium element and an element from the semiconductor layer, and has a thickness in a range from about 1 nm to about 3 nm. In one or more of the foregoing or following embodiments, the semiconductor layer is formed of silicon. In one or more of the foregoing or following embodiments, the germanium layer and the semiconductor layer are doped by an n-type dopant including phosphorus. In one or more of the foregoing or following embodiments, the interfacial epitaxial layer is formed of $Si_xGe_{1-x}$, where x is a number between 0 and 1. In one or more of the foregoing or following embodiments, the interfacial epitaxial layer includes at least two stacked layers of $Si_yGe_{1-y}$ over $Si_xGe_{1-x}$, where x and y are between 0 and 1 and satisfy x<y.

The present application also discloses an exemplary method of manufacturing a finFET transistor device. The method has operations of forming a fin made of germanium, forming a source/drain epitaxial layer on each of source/drain regions of the fin, and forming a contact layer on the source/drain regions. The source/drain epitaxial layer includes a first layer on the fin and a second layer on the first layer. The first layer includes germanium element and an element from the second layer, and has a thickness in a range from about 1 nm to about 3 nm. In one or more of the foregoing or following embodiments, the second layer is a silicon layer. In one or more of the foregoing or following embodiments, the first layer is a $Si_xGe_{1-x}$ layer, where x is a number between 0 and 1. In one or more of the foregoing or following embodiments, the second layer is a $Si_yGe_{1-y}$ layer, where y is a number between 0 and 1, and satisfying a relationship of x<y. In one or more of the foregoing or following embodiments, x is equal to 0.3 and y is equal to 0.6. In one or more of the foregoing or following embodiments, the method further includes epitaxy of the formed first and second layers at a temperature in a range from 330° C. to 370° C. In one or more of the foregoing or following embodiments, the first layer is formed by the same method as the second layer. In one or more of the foregoing or following embodiments, the first layer is formed by a different method than the second layer. In one or more of the foregoing or following embodiments, an interface between the fin and the first layer and an interface between the first layer and the second layer are well-defined and organized.

The present application discloses an embodiment of a field effect transistor device having a channel made of germanium and a source/drain portion. The source/drain portion includes a germanium layer, an interfacial epitaxial layer on the germanium layer, a semiconductor layer on the interfacial epitaxial layer, and a conductive layer on the semiconductor layer, and the interfacial epitaxial layer contains germanium and an element from the semiconductor layer, and has a thickness in a range from about 1 nm to about 3 nm. In one or more of the foregoing or following embodiments, the semiconductor layer is formed of silicon. In one or more of the foregoing or following embodiments, the germanium layer and the semiconductor layer are doped by an n-type dopant including phosphorus. In one or more of the foregoing or following embodiments, the interfacial epitaxial layer is formed of $Si_xGe_{1-x}$, where x is a number between 0 and 1. In one or more of the foregoing or following embodiments, the interfacial epitaxial layer is formed of two stacked layers of $Si_xGe_{1-x}$ of different compositions. In one or more of the foregoing or following embodiments, the interfacial epitaxial layer has a composition gradually changing along a thickness direction of the interfacial epitaxial layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first interfacial epitaxial layer disposed over a first semiconductor layer that is disposed over a substrate, wherein the first semiconductor layer comprises germanium, and wherein the first interfacial epitaxial layer comprises a first combination of germanium and a first element different from germanium;
   a second interfacial epitaxial layer disposed over the first interfacial epitaxial layer, wherein the second interfacial epitaxial layer comprises a second combination of germanium and the first element, and wherein an amount of the germanium in the first combination is higher than an amount of germanium in the second combination;
   a second semiconductor layer disposed over the second interfacial epitaxial layer, wherein the second semiconductor layer comprises the first element,
   wherein an amount of germanium gradually decreases in the first and second interfacial epitaxial layers from the first semiconductor layer to the second semiconductor layer, and the amount of the first element gradually increases in the first and second interfacial epitaxial layers from the first semiconductor layer to the second semiconductor layer;
   wherein the first semiconductor layer under the first interfacial epitaxial layer consists essentially of germanium and a first dopant, and the second semiconductor layer over the second interfacial epitaxial layer consists essentially of the first element and a second dopant; and
   a conductive layer disposed over the second semiconductor layer.

2. The semiconductor device of claim 1, further comprising:
   an interlayer dielectric layer disposed over the second semiconductor layer, wherein the conductive layer is disposed in a hole on top of the second semiconductor layer.

3. The semiconductor device of claim 1, wherein the first interfacial epitaxial layer has a thickness in a range from about 1 nm to about 3 nm.

4. The semiconductor device of claim 1, wherein the first element is silicon.

5. The semiconductor device of claim 2, wherein the first and the second semiconductor layers are doped by an n-type dopant including phosphorus.

6. The semiconductor device of claim 1, wherein the first interfacial epitaxial layer is formed of $Si_xGe_{1-x}$, where x changes between 0 and 1.

7. The semiconductor device of claim 1, wherein the second interfacial epitaxial layer that is formed over the first interfacial epitaxial layer is formed of $Si_yGe_{1-y}$ layer, and wherein the first interfacial epitaxial layer is formed of $Si_xGe_{1-x}$, where x and y change between 0 and 1 and satisfy x<y.

8. A semiconductor device, comprising:
   a first source/drain interfacial epitaxial layer disposed over each of source/drain regions of a fin that comprises a first element,
   wherein the first source/drain interfacial epitaxial layer comprises a first combination of the first element and a second element different from the first element;
   a second interfacial epitaxial layer disposed over the first source/drain interfacial epitaxial layer,
   wherein the second interfacial epitaxial layer comprises a second combination of the first element and the second element, and wherein an amount of the first element in the first combination is higher than an amount of the first element in the second combination; and
   a second semiconductor layer disposed over the second interfacial epitaxial layer, wherein an amount of the first element gradually decreases in the first source/drain interfacial epitaxial layer and the second interfacial epitaxial layer from the fin to the second semiconductor layer, and the amount of the second element gradually increases in the first source/drain interfacial epitaxial layer and the second interfacial epitaxial layer from the fin to the second semiconductor layer;
   wherein the fin under the first source/drain interfacial epitaxial layer consists essentially of the first element and a dopant, and the second semiconductor layer over the second interfacial epitaxial layer consists essentially of the second element and a dopant; and
   a contact layer disposed over the source/drain regions.

9. The semiconductor device of claim 8, wherein the first element is germanium and the fin is formed of germanium.

10. The semiconductor device of claim 8, wherein the first source/drain interfacial epitaxial layer comprises germanium and the second element and has a thickness in a range from about 1 nm to about 3 nm.

11. The semiconductor device of claim 9, wherein the second element is silicon.

12. The semiconductor device of claim 8, wherein the first source/drain interfacial epitaxial layer is a $Si_xGe_{1-x}$ layer, where x changes between 0 and 1.

13. The semiconductor device of claim 12, wherein the second interfacial epitaxial layer is a $Si_yGe_{1-y}$ layer, where y changes between 0 and 1, and satisfying a relationship of x<y.

14. The semiconductor device of claim 13, wherein an average of x is equal to 0.3 and an average of y is equal to 0.6.

15. The semiconductor device of claim 8, further comprising:
   a gate structure disposed between source/drain regions of the fin.

16. A semiconductor device, comprising:
   a first interfacial epitaxial layer disposed over a first semiconductor layer that is disposed over a substrate, wherein the first semiconductor layer comprises a first element;
   a second interfacial epitaxial layer disposed over the first interfacial epitaxial layer;
   a second semiconductor layer disposed over the second interfacial epitaxial layer, wherein the second semiconductor layer comprises a second element;
   wherein the first interfacial epitaxial layer comprises a first combination of the first element from the first semiconductor layer and the second element from the second semiconductor layer,
   wherein the second interfacial epitaxial layer comprises a second combination of the first element from the first semiconductor layer and the second element from the second semiconductor layer,
   wherein an amount of the first element in the first combination is higher than an amount of the first element in the second combination, and
   wherein an amount of the first element gradually decreases in the first and second interfacial epitaxial layers from the first semiconductor layer to the second semiconductor layer, and an amount of the second element gradually increases in the first and second interfacial epitaxial layers from the first semiconductor layer to the second semiconductor layer, and wherein the first semiconductor layer under the first interfacial epitaxial layer consists essentially of the first element and a dopant, and the second semiconductor layer over the second interfacial epitaxial layer consists essentially of the second element and a dopant; and
   a conductive layer disposed over the second semiconductor layer.

17. The semiconductor device of claim 16, wherein the first element is germanium and the second element is silicon.

18. The semiconductor device of claim 17, wherein the first interfacial epitaxial layer is formed of $Si_xGe_{1-x}$, where x changes between 0 and 1, wherein the second interfacial epitaxial layer is formed of $Si_yGe_{1-y}$, where y changes between 0 and 1, and wherein y>x.

19. The semiconductor device of claim 18, wherein an average of x is equal to 0.3 and an average of y is equal to 0.6.

20. The semiconductor device of claim 16, wherein the first semiconductor layer and the second semiconductor layer are doped by an n-type dopant including phosphorus.

* * * * *